United States Patent [19]

Cowardin et al.

[11] 4,105,980
[45] Aug. 8, 1978

[54] GLITCH FILTER CIRCUIT

[75] Inventors: Robert Lewis Cowardin, Cary; George Joseph Laurer, Raleigh, both of N.C.

[73] Assignee: International Business Machines Corporation, Armonk, N.Y.

[21] Appl. No.: 809,965

[22] Filed: Jun. 27, 1977

[51] Int. Cl.² ............................................. H03K 13/32
[52] U.S. Cl. ..................................... 328/165; 328/55; 328/207; 307/273
[58] Field of Search ................... 328/55, 58, 165, 111, 328/207; 307/273

[56] References Cited

U.S. PATENT DOCUMENTS

| | | | |
|---|---|---|---|
| 3,195,056 | 7/1965 | Trautwein | 328/165 |
| 3,504,288 | 3/1970 | Ross | 307/273 |
| 3,576,496 | 4/1971 | Garagnon | 328/55 |
| 3,588,705 | 6/1971 | Paine | 328/165 X |
| 3,634,869 | 1/1972 | Hsueh | 328/111 X |
| 3,668,423 | 6/1972 | Couch | 307/273 |

*Primary Examiner*—John S. Heyman
*Attorney, Agent, or Firm*—John B. Frisone

[57] ABSTRACT

A circuit for filtering positive and negative glitches (i.e., dropouts and noise spikes) in a pulse-like signal to be processed, utilizes a single timing element which introduces a uniform delay in both the leading and trailing edges of the pulse-like signal, thus eliminating pulse-width distortion of the signal. A single adjustment may be made which has the same effect on both the leading and trailing edges making a uniform adjustment of both delays easily achieved.

4 Claims, 2 Drawing Figures

GLITCH FILTER CIRCUIT

BACKGROUND OF THE INVENTION

1. Field of the Invention

The invention relates to filtering circuits in general and more particularly to an adjustable circuit which is suitable for filtering out noise spikes and dropouts (i.e., glitches) in a pulse-like signal without introducing pulse width distortions and which only requires a single adjustment to change the glitch width filtered.

2. Description of the Prior Art

Prior art glitch filter circuits known to applicants utilize separate delay elements for interacting with positive and negative pulse transitions. The prior art solutions require that the two delay elements be adjusted to the same value in order to eliminate or minimize pulse width distortion. This dual adjustment is difficult under ideal conditions and even more burdensome under field conditions when an adjustment to the delay or filter characteristics is necessary.

SUMMARY OF THE INVENTION

The invention contemplates a glitch filter circuit in which a single delay element responsive to the leading and trailing edges of a pulse-like signal is used to enable first and second trigger circuits responsive to the pulse-like signal and its inversion, respectively, to permit said circuits to change state only if the signal state which enabled said delay element persists for the period timed, a first feedback path between the second trigger circuit and the first trigger circuit to restore said first trigger circuit when said second trigger circuit responds to signal transition, a second feedback path between the second trigger circuit and the first trigger circuit to restore the first trigger circuit to its initial condition under control of said delay means at the end of each complete cycle of said pulse-like signal, and output means connected to the first trigger circuit for providing a glitch filtered replica of the said pulse-like signal.

BRIEF DESCRIPTION OF THE DRAWINGS

In FIG. 1 a number of industry standard TTL circuits are interconnected as shown. Trigger circuits 11 and 12 may utilize standard type 7474 or equivalent. AND invert circuits 14, 15 and 16 and OR invert circuit 17 may utilize standard type 7400 or equivalent. Inverter circuit 18 may utilize standard circuit 7404 or equivalent and single shot circuit 19 may utilize standard circuit 74121 or equivalent. An external variable capacitor 20 connected to the timing pins of single shot circuit 19 may be set to regulate the switching period of single shot 19. The pulse-like input signal is applied to the input conductor 10 and the circuit output appears on output conductor 21 connected to the Q output of trigger circuit 11.

Figure 1:
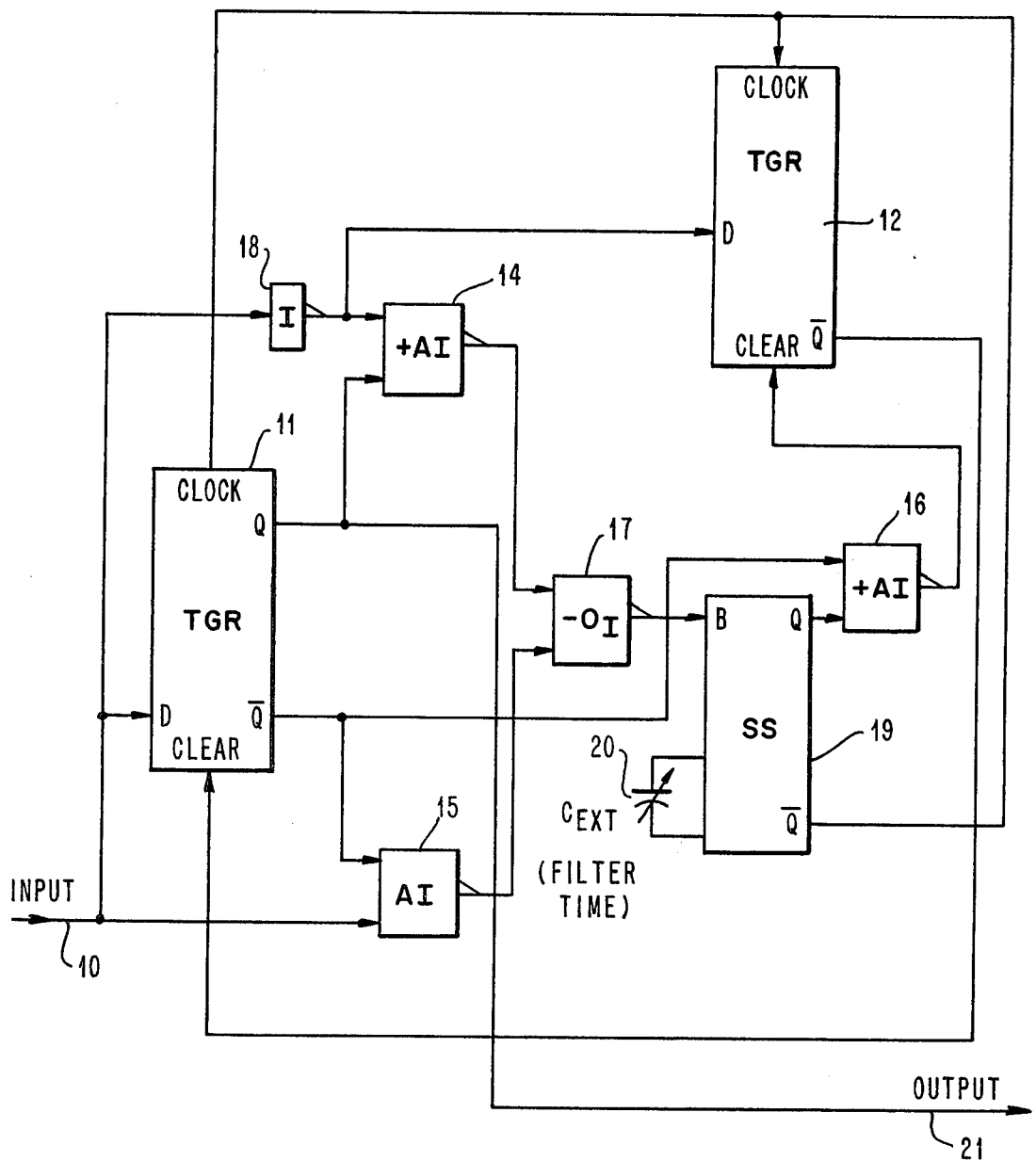
FIG. 1 is a schematic circuit diagram of a glitch filter circuit constructed in accordance with the invention; and, FIG. 2 is a series of graphs illustrating the signal form at several points in the circuit illustrated in FIG. 1.
Figure 2:
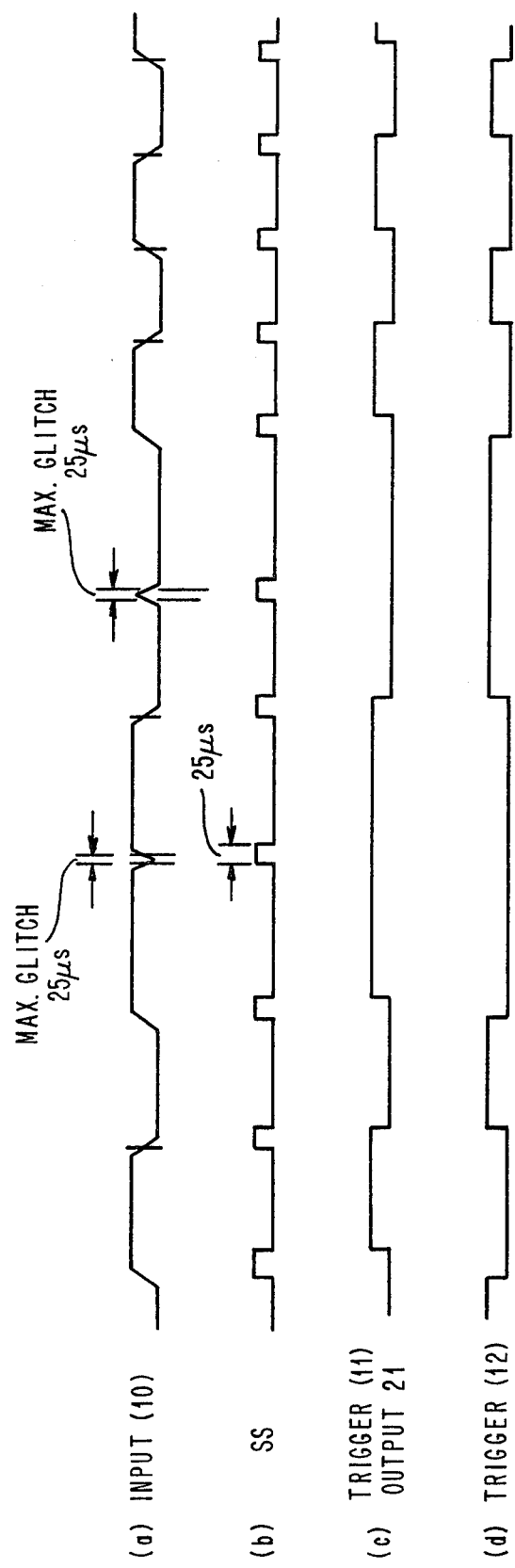

The signal to be filtered (deglitched) is illustrated at (a) in FIG. 2. This signal is applied to the (D) gate of trigger 11 and "Anded" with the ($\overline{Q}$) output of trigger 11 in And invert circuit 15. If the conditions are satisfied, single shot circuit 19 is energized via OR invert circuit 17 and produces a negative pulse at the ($\overline{Q}$) output. The (Q) output of single shot circuit 19 is illustrated at (b) in FIG. 2. The ($\overline{Q}$) output is the inverse and is therefore not illustrated. The negative pulse generated when the conditions are satisfied is fed back to the clock inputs of triggers 11 and 12. If the input signal at (D) is still up (positive) at the termination of the negative pulse from single shot circuit 19, trigger 11 will turn on (see graph C, FIG. 2). When trigger 11 turns on, the output 21 goes positive (C of FIG. 2 first positive transition). The positive transition has been delayed from the rise of the input signal by an amount of time equal to the time the ($\overline{Q}$) output from single shot circuit 19 remains negative (compare graphs a, b and c, FIG. 2).

The inverted input signal from inverter 18 is applied to the (D) input of trigger 12 and "Anded" with the (Q) output of trigger 11 in AND invert circuit 14. Thus, when the input signal goes negative, with trigger circuit 11 on (Q up or positive), the single shot circuit 19 is again started via OR invert circuit 17 and a second negative pulse is produced on the ($\overline{Q}$) output of circuit 19. This pulse is applied to the clock inputs of triggers 11 and 12 and if the input signal on line 10 is still down (up at D input of trigger 12 due to inverter 18), trigger 12 will turn on at the end of the negative pulse from single shot circuit 19. Trigger 11 will turn off at this time since the ($\overline{Q}$) output of trigger 12 is directly connected to the clear input of trigger 11. When trigger 11 turns off, the output line 21 follows the (Q) output of trigger 11 and falls (see c, FIG. 2). The fall of the output on line 21 is delayed from the fall of input by an amount equal to the single shot time. Since this delay and the one previously described for trigger 11 are timed by the same single shot circuit, no pulse width distortion occurs at the output. On the next rise of the input signal, the single shot circuit 19 is again triggered as described above and AND invert circuit 16 develops an output which clears trigger circuit 12 restoring that circuit to the initial condition described above.

The next signal cycle (2nd positive and negative pulses, see a, FIG. 2) include glitches in the form of a dropout and a noise spike, respectively. The leading edges of these glitches initiate circuit action as described above; however, the glitches do not persist beyond the time period of the negative pulses from single shot circuit 19 and therefore are removed from the output signal provided on conductor 21. A simple adjustment of capacitor 20 changes the width of the negative pulse from single shot 19 and may be easily adjusted in the field to compensate for different noise conditions present in the input signal.

While the invention has been particularly shown and described with reference to a preferred embodiment thereof, it will be understood by those skilled in the art that various changes in form and details may be made therein without departing from the spirit and scope of the invention.

What is claimed is:

1. A filter circuit for removing glitches which may include dropouts or noise spikes from a pulse-like input signal comprising:

a delay circuit responsive to the leading and trailing edges of the said pulse-like input signal for providing a first control signal a predetermined time after the said leading and trailing edges of the pulse-like input signal;

a first trigger circuit responsive to the input signal and the control signal for providing a first output when the input signal is in a first state at receipt of the first control signal;

a second trigger circuit responsive to the input signal and the control signal for assuming a first state and providing a second control signal when the input signal is in a second state at receipt of the first control signal;

means for applying the second control signal to said first trigger circuit to cause said first trigger circuit to provide a second output, said first and second outputs being a filtered replica of the input signal; and means responsive to the inverse of the second output and the first control signal for resetting said second trigger circuit to a second state.

2. A filter circuit for removing glitches which may include dropouts and noise spikes from a pulse-like input signal comprising:

a first trigger circuit which is capable of assuming one of two states and has at least one input connected to the input signal, first and second outputs which are oppositely phased and assume one output level or another depending on the state of the circuit, a clock control input for enabling the trigger circuit to assume a state determined by the condition of the input signal and a clear input for restoring the trigger circuit to a predetermined state;

an inverter circuit responsive to the input signal for providing an inverted input signal;

a delay circuit responsive to the input signal, the inverted input signal from said inverter circuit and the first and second outputs from said first trigger circuit for providing a pulse-like control signal of predetermined length each time the input signal undergoes a transition from one level to another;

a second trigger circuit substantially the same as said first trigger circuit having an input connected to the inverter circuit output for receiving the inverted input signal;

means for applying the control pulse to the clock control inputs of the first and second triggers whereby said triggers assume a state corresponding to the signal present at the input at the termination of the control pulse;

first means for applying the second trigger second output to the clear input of the first trigger to control the state of the first trigger as a function of the second output;

circuit means responsive to the first trigger second output and the control pulse for providing a clear signal to the second trigger clear input for controlling the state of the second trigger as a function of the state of the first trigger second output and the control pulse; and, second means connected to the first trigger first output for providing an output signal which is a glitch filtered replica of the input signal.

3. A filter circuit as set forth in claim 2 in which said delay circuit includes:

a single shot circuit having an input and at least one output which provides a pulse of predetermined length each time the signal applied to the input undergoes a predetermined transition;

first gate circuit means responsive to the input signal and one output of the first trigger circuit for applying a signal at predetermined coincidence to the single shot circuit input for causing said circuit to provide the control pulse output coincident with a positive transition of the input signal; and, second gate circuit means responsive to the inverted input signal from the said inverter circuit and the other output of the first trigger circuit for applying a signal at predetermined coincidence to the single shot circuit to provide the control pulse output coincident with a negative transition of the input signal.

4. A filter circuit as set forth in claim 3 in which said single shot circuit includes an adjustable circuit element which may be adjusted to control the width of the control pulse to compensate for different noise environments.

* * * * *